United States Patent
Wilson et al.

(10) Patent No.: US 11,226,444 B2
(45) Date of Patent: Jan. 18, 2022

(54) ELECTRONIC DEVICE HAVING COLORED SURFACES WITH NEUTRAL TRANSMISSION

(71) Applicant: Apple Inc., Cupertino, CA (US)

(72) Inventors: James R. Wilson, Cupertino, CA (US); Liliya Lyandres, Sunnyvale, CA (US); Ove Lyngnes, Carmel Valley, CA (US)

(73) Assignee: Apple Inc., Cupertino, CA (US)

( * ) Notice: Subject to any disclaimer, the term of this patent is extended or adjusted under 35 U.S.C. 154(b) by 277 days.

(21) Appl. No.: 16/378,200

(22) Filed: Apr. 8, 2019

(65) Prior Publication Data

US 2020/0096688 A1 Mar. 26, 2020

Related U.S. Application Data

(60) Provisional application No. 62/734,069, filed on Sep. 20, 2018.

(51) Int. Cl.
| | |
|---|---|
| *G02B 5/28* | (2006.01) |
| *H01L 33/44* | (2010.01) |
| *G01J 1/04* | (2006.01) |
| *G01J 1/42* | (2006.01) |

(52) U.S. Cl.
CPC ............ *G02B 5/285* (2013.01); *G01J 1/0488* (2013.01); *G01J 1/4204* (2013.01); *H01L 33/44* (2013.01)

(58) Field of Classification Search
CPC ....... G01N 15/0625; G01N 2015/0046; G02B 21/365; G02B 21/36; G02B 21/361
See application file for complete search history.

(56) References Cited

U.S. PATENT DOCUMENTS 10,845,508 B2 * 11/2020 Powell .................... G02B 5/021
2018/0052277 A1 2/2018 Schowengerdt et al.

FOREIGN PATENT DOCUMENTS

| EP | 1901095 A1 | 3/2008 |
|---|---|---|
| WO | 2013138003 A1 | 9/2013 |

* cited by examiner

*Primary Examiner* — Georgia Y Epps
*Assistant Examiner* — Don J Williams
(74) *Attorney, Agent, or Firm* — Treyz Law Group, P.C.; G. Victor Treyz; David K. Cole

(57) ABSTRACT

An electronic device may be provided with input-output devices and other components such as optical components that emit light and optical components that detect light. An optical component covering structure may be interposed between an interior region of the electronic device and an exterior region that surrounds the electronic device. The optical components may be formed in the interior region of the electronic device. The optical component covering structure may overlap the optical components. The optical component covering structure may be configured to exhibit a flat visible light transmission spectrum. This neutral light transmission characteristic allows the overlapped optical components to emit and/or receive light through the optical component covering structure without imposing an undesired color cast. The optical component covering structure may include first and second layers with complementary light transmission characteristics. When viewed from the exterior region, the optical component covering structure may exhibit a non-neutral color.

20 Claims, 8 Drawing Sheets

ELECTRONIC DEVICE HAVING COLORED SURFACES WITH NEUTRAL TRANSMISSION

This application claims the benefit of provisional patent application No. 62/734,069, filed Sep. 20, 2018, which is hereby incorporated by reference herein in its entirety.

BACKGROUND

This relates generally to electronic devices, and, more particularly, to electronic devices with optical components.

Electronic devices such as laptop computers, cellular telephones, voice-controlled speakers, and other equipment may be provided with optical components. These optical components may include light sensors, displays, light-emitting diodes, and other components that emit or detect light.

In some devices, structures are formed that exhibit a neutral transmission spectrum. For example, a clear display cover layer that overlaps a display in a handheld device may exhibit even light transmission across all wavelengths of visible light, so as not to impart a desired color cast to images that are presented on the display. As another example, a black cover plate in a voice-controlled speaker may exhibit a neutral color spectrum, so that light-emitting diodes under the cover plate are not provided with an undesired color cast when displaying visual patterns for a user. In devices such as cellular telephones, an ambient light sensor window may be covered with black ink. The black ink may have a relatively neutral visible light transmission spectrum, so that an overlapped color ambient light sensor can make color ambient light measurements without picking up a color cast as ambient light passes through the ambient light sensor window.

In arrangements such as these, the structures through which emitted and detected light is passing are clear or have a neutral appearance (e.g., black, white, or gray). It can therefore be difficult or impossible to provide the surface of an electronic device with a desired non-neutral color.

SUMMARY

An electronic device may be provided with input-output devices and other components. These components may include optical components such as components that emit light and components that detect light. Optical components in the electronic device may include light-emitting diode arrays, displays, color ambient light sensors, and other devices.

An optical component covering structure may overlap the optical components. The optical components may be located in an interior region of the electronic device. An exterior region may surround the electronic device. The optical component covering structure may be located between the interior region and the exterior region and may overlap optical components in the interior region.

The optical component covering structure may be configured to exhibit a non-neutral color when viewed from the exterior region while exhibiting a flat visible light transmission spectrum. The flat light transmission spectrum allows optical components to emit and/or receive light through the optical component covering structure without being affected by an undesired color cast.

The optical component covering structure may include first and second layers with complementary light transmission characteristics. For example, a colored ink layer and a thin-film interference filter or other layers with complementary visible light transmission characteristics may be supported on a clear substrate layer. Due to the complementary visible light transmission characteristics of the first and second layers, the overall visible light transmission spectrum of the optical component covering structure will be flat. When viewed from the exterior region, the optical component covering structure may exhibit a non-neutral color (e.g., red, gold, etc.), so that the electronic device can be provided with a desired appearance.

DETAILED DESCRIPTION

Figure 1:
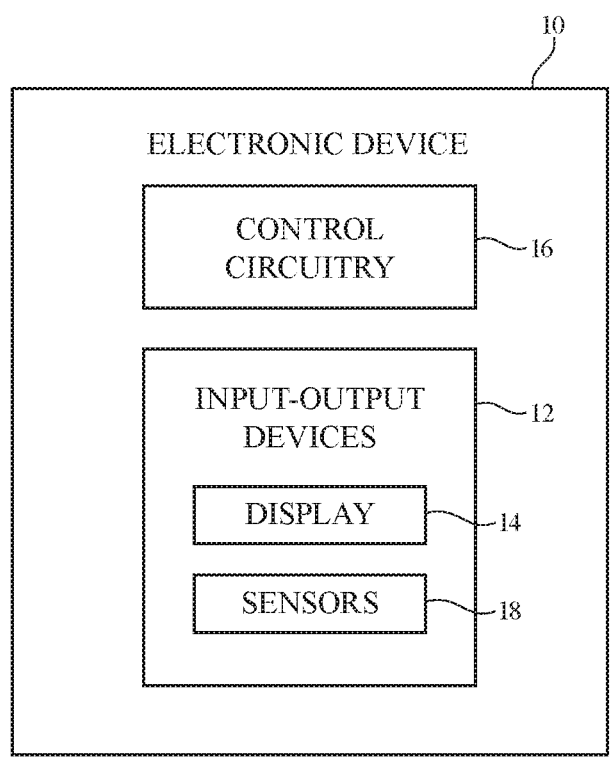
FIG. 1 is a schematic diagram of an illustrative electronic device having optical components in accordance with an embodiment.

An illustrative electronic device of the type that may be provided with optical components overlapped by optical component covering structures is shown in FIG. 1. Electronic device 10 may be a voice-controlled speaker, a computing device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, light-emitting diodes (e.g., arrays of light-emitting diodes), lasers, and/or other light-emitting components, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Input-output devices 12 may also include sensors 18. Sensors 18 may include a capacitive sensor, a light-based proximity sensor, a magnetic sensor, an accelerometer, a force sensor, a touch sensor, a temperature sensor, a pressure sensor, a compass, a microphone, and other sensors. Sensors 18 may also include one or more color ambient light sensors. A color ambient light sensor may be used to measure the color (color spectrum, color temperature, color coordinates, etc.) of ambient light and may be used to measure ambient light intensity.

Sensors 18 that emit and/or detect light and input-output devices 12 such as display 14, arrays of light-emitting diodes, and other components that emit light may sometimes be referred to as optical components. Control circuitry 16, input-output devices 12, and other portions of device 10 may be mounted within structures formed from glass, polymer, metal, and/or other materials. These structures may form a housing for device 10 that separates internal components (control circuitry 16, input-output devices 12, etc.) in an interior region of device 10 from an external region that surrounds device 10. Some or all of these structures may form optical component covering structures.

Optical components in input-output devices 12 may be mounted under the optical component covering structures. The optical component covering structures may exhibit neutral visible light transmission spectrums. The neutral light transmission characteristics of the optical component covering structures may allow the optical components to emit and/or measure light without concern that the covering structures are imparting an undesired color cast to emitted or received light. The optical covering structures can have a colored outward appearance. For example, the optical covering structures may exhibit an external appearance with a non-neutral (non-gray) color cast such as a red appearance, blue appearance, green appearance, yellow appearance, gold appearance, or other non-neutral color.

Figure 2:
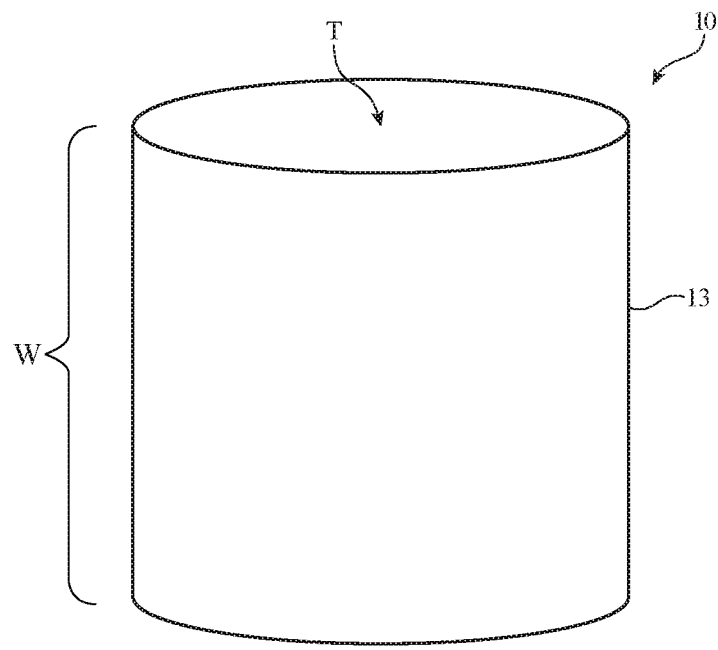
FIGS. 2 and 3 are perspective views of illustrative electronic devices in accordance with embodiments.
Figure 3:
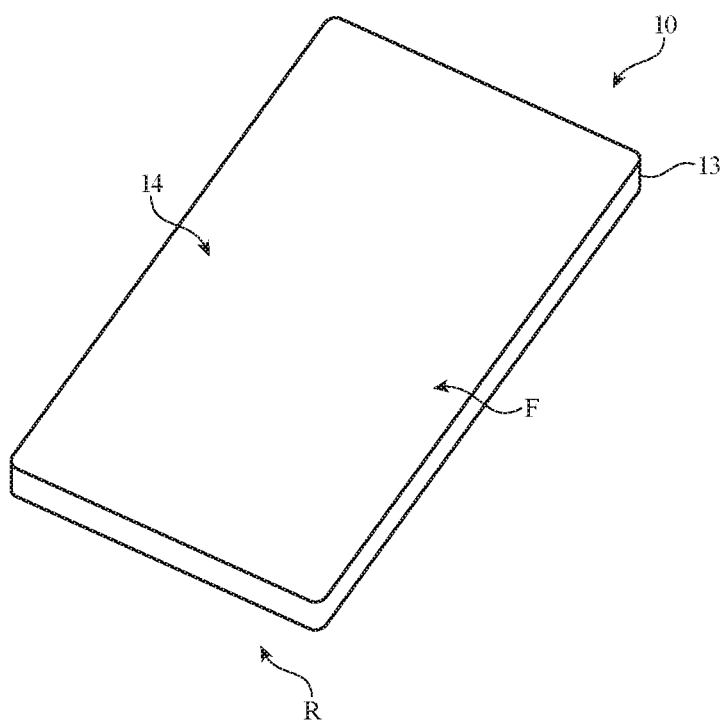

Perspective views of illustrative electronic devices with optical component covering structures of the type that may exhibit a neutral visible light transmission spectrum and a non-neutral outward appearance are shown in FIGS. 2 and 3.

As shown in the example of FIG. 2, device 10 may have a shape with curved surfaces. Device 10 may, for example, have a housing such as housing 13 with a cylindrical shape. Housing 13, which may sometimes be referred to as a body or support structure for device 10 may include fabric, metal, glass, polymer, composite materials such as carbon-fiber materials, natural materials such as wood, and/or other materials. For example, upper portion T of device 10 may be covered with a polymer structure and side portion W of device 10 may be covered with fabric (e.g., to allow sound from an internal speaker in device 10 to pass through the walls of device 10). In this type of arrangement, some or all of upper portion T may serve as a colored optical covering structure with a neutral visible light transmission characteristic and may overlap one or more optical components. Optical components may also be overlapped by an optical component covering structure that is formed on some or all of side portion W. Optical components and other input-output devices 12 may be mounted in an interior region of device 10 (e.g., the interior of housing 13). The optical component covering structure may be located between the exterior of device 10 and the interior of device 10. The interior of device 10 may include the optical components and other input-output devices 12 (e.g., speakers, etc.).

As shown in the example of FIG. 3, housing 13 of device 10 may be a hand-held housing. Front face F of device 10 may be formed from a transparent display cover layer that covers display 14 and other optical components. Peripheral border (edge) portions of the display cover layer and/or other portions of device 10 (e.g., sidewalls in housing 13, a rear housing wall on rear face R of device 10, etc.) may be provided with a coating or other structure that allows these portions of device 10 to serve as a colored optical component covering structure with a neutral visible light transmission spectrum. Housing 13 of device 10 of FIG. 3 (e.g., optical component covering structures of device 10) and other housing structures and/or supporting structures for device 10 may be formed from fabric, metal, glass, polymer, composite materials such as carbon-fiber materials, natural materials such as wood, and/or other materials.

As shown in the example of FIG. 3, housing 12 of device 10 may be a hand-held housing. Front face F of device 10 may be formed from a transparent display cover layer that covers display 14 and other optical components. Peripheral border (edge) portions of the display cover layer and/or other portions of device 10 (e.g., sidewalls in housing 12, a rear housing wall on rear face R of device 10, etc.) may be provided with a coating or other structure that allows these portions of device 10 to serve as a colored optical component covering structure with a neutral visible light transmission spectrum. Housing 12 of device 10 of FIG. 3 (e.g., optical component covering structures of device 10) and other housing structures and/or supporting structures for device 10 may be formed from fabric, metal, glass, polymer, composite materials such as carbon-fiber materials, natural materials such as wood, and/or other materials.

To provide an optical component covering structure in device 10 with an outward appearance of a desired non-neutral color (e.g., a color other than black, gray, or white), the optical component covering structure may be provided with multiple layers of material having complementary visible light transmission spectrums. Consider, as an example, a scenario in which the optical component covering structure has an inner layer and an outer layer. These layers may be formed on a transparent substrate (as an example). The inner layer (e.g., the layer facing the interior region of device 10) may be formed from a thin-film interference filter. The thin-film interference filter may have a stack of thin-film layers. The stack of layers may be, for example, a dielectric stack formed from layers of inorganic and/or organic dielectric materials of alternating higher and lower refractive index values. These layers may include, for example, silicon oxide, silicon nitride, aluminum oxide, other metal oxides, etc. The outer layer (the exterior-facing layer) may be formed from a colored ink (e.g., a polymer containing a colorant such as dye and/or pigment that imparts a non-neutral transmission spectrum to the polymer).

Figure 4:
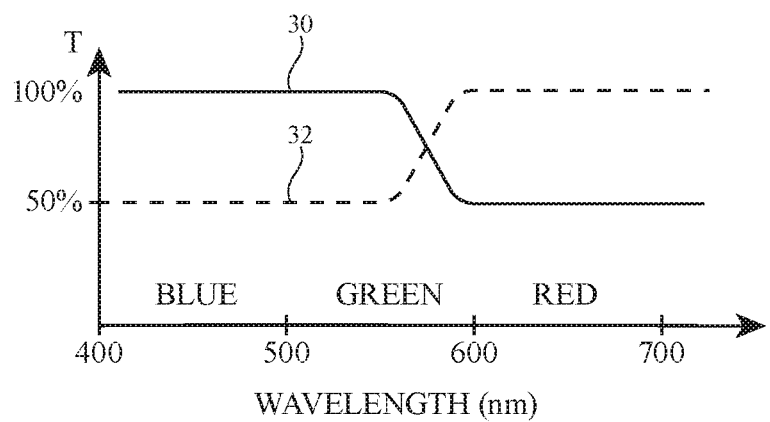
FIG. 4 is a graph showing illustrative complementary visible light transmission spectrums that may be used to form layers in an optical component covering structure with a colored outward appearance in accordance with an embodiment.

In this type of arrangement, the inner layer may have a transmission spectrum at visible wavelengths (e.g., wavelengths from 400 nm to 700 nm) of the type shown by curve 30 of FIG. 4 and the outer layer may have a visible-light transmission spectrum of the type shown by curve 32. The shapes of curves 30 and 32 may be complementary, so that the overall light transmission of the inner and outer layers taken together is flat over visible light wavelengths. As shown in the example of FIG. 4, the outer coating may transmit less blue and green light than red light (as an example) and the inner coating may transmit less red light than blue and green light (as an example).

Figure 5:
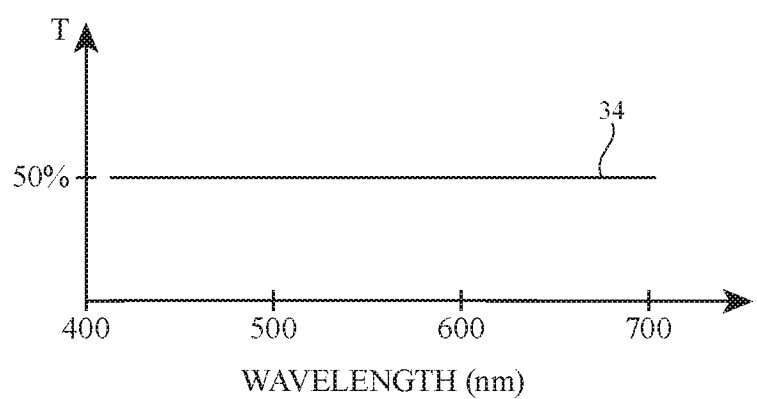
FIG. 5 is a graph showing an illustrative visible light transmission spectrum for an optical component covering structure in accordance with an embodiment.
Figure 6:
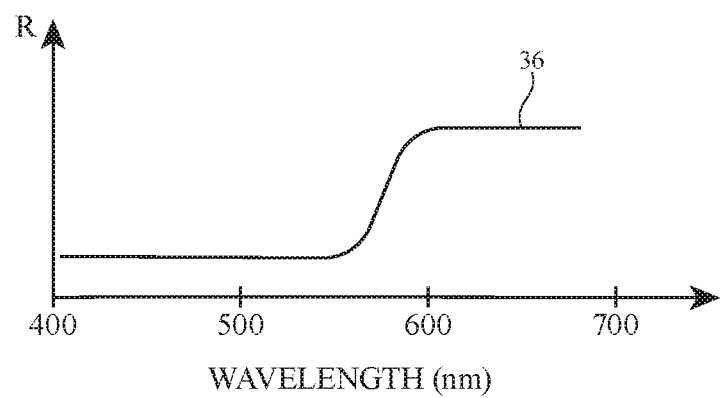
FIG. 6 is a graph showing an illustrative reflection spectrum for an optical component covering structure in accordance with an embodiment.

Due to the complementary shapes of the light transmission spectrums of the inner and outer layers, the visible light transmission spectrum of the optical covering structures may have a neutral (wavelength invariant) characteristic of the type shown by curve 34 of FIG. 5 (e.g., light transmission may vary by less than 15%, less than 10%, less than 5%, or other suitable amount across visible wavelengths between 400 nm and 700 nm). At the same time, the overall reflection spectrum of the optical covering structures may have a non-neutral color. If, as in the current example, the outer layer is formed from colored ink such as red ink, the appearance of the optical component covering structure may be red. The outer layer of red ink tends to absorb blue and green light and appears red when exposed to white light in the exterior region. The inner thin-film interference filter layer (in this example) also tends to reflect more red light than green and blue light. As a result of the preferential reflection of red light by the inner layer and the preferential absorption of blue and green light by the outer layer, the optical component covering structure may have a red appearance, as indicated by the red light reflection spectrum given by illustrative curve 36 of FIG. 6.

If desired, the optical component covering structures may have other outward appearances. For example, the optical component covering structures may have an appearance that is blue, green, yellow, gold, rose gold, or other non-neutral color. The outer layer in this type of configuration may have one or more reflectivity peaks (e.g., a green reflectivity peak in an example in which the optical component covering structure has a green appearance). A neutral transmission characteristic can be obtained by providing the inner layer with a complementary transmission spectrum as described in connection with curves 30 and 32 of FIG. 4.

In general, any suitable number of layers may be used in forming the optical component covering structure (e.g., two, at least two, three, at least three, at least four, etc.), provided that the overall transmission spectrum is neutral across visible wavelengths while the overall reflection spectrum is not neutral. Each layer may be configured to produce desired transmission, reflection, and absorption spectrums. Layers may be formed from polymer or other binder with colorant (e.g., dye and/or pigment), metal, semiconductor, thin-film layers (e.g., dielectric layers, metal layers, and/or semiconductor layers configured to form a thin-film stack), and/or other materials. In some arrangements, the layers used in forming the optical component covering structure may have desired bulk optical properties (e.g., desired bulk absorption, transmission, and reflection characteristics). In other arrangements, thin films may be used to produce desired thin-film interference effects. For example, a stack of thin films may be configured to form a thin-film interference filter that exhibits a desired transmission spectrum, reflection spectrum, and absorption spectrum. The layers of material in the optical component covering structure may be characterized by low haze or may have sufficient haze to serve as diffuser layers. As an example, particles of high refractive index such as titanium oxide particles may be incorporated into a polymer layer to scatter transmitted and/or reflected light and thereby cause the polymer layer to serve as a diffuser.

Figure 7:
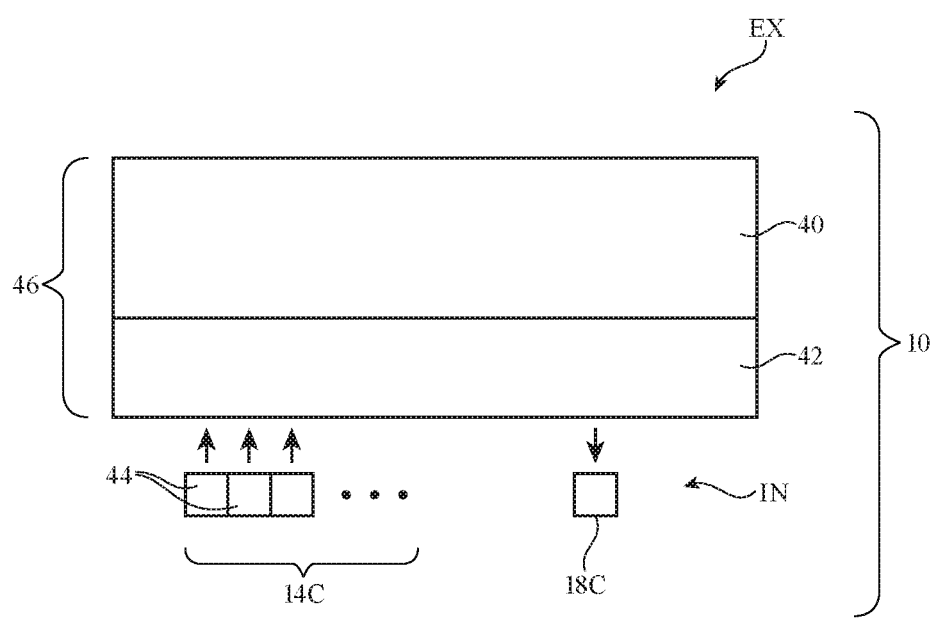
FIG. 7 is a cross-sectional side view of an optical component covering structure that is overlapping and covering optical components such as an illustrative light-emitting component and an illustrative light-receiving component in accordance with an embodiment.

FIG. 7 is a cross-sectional side view of a portion of an illustrative device with optical component covering structures. As shown in FIG. 7, device 10 may have an interior region IN that is separated from exterior region EX by optical component covering structure 46. Exterior region EX may surround device 10. Structure 46 may, if desired, have one or more supportive layers such as substrate layer 40. Substrate layer 40 may be formed from glass, polymer, sapphire or other crystalline materials, or other transparent substrate materials. The visible light transmission spectrum of substrate layer 40 may be non-neutral (e.g., layer 40 may be a colored transparent layer) or neutral (e.g., layer 40 may be a transparent layer with a gray tint or may be a clear layer). Illustrative configurations in which the visible light transmission spectrum of substrate 40 is neutral may sometimes be described as an example.

Substrate 40 may have one or more inner and/or outer coating layers such as illustrative coating layer 42. Coating layer 42, which may include sublayers such as an outer coating on substrate 40 and an inner coating on the outer coating, may be characterized by a neutral transmission spectrum and a non-neutral reflection spectrum, so that optical component covering structure 46 exhibits a neutral transmission spectrum and a non-neutral reflection spectrum, as described in connection with FIGS. 4, 5, and 6.

As shown in FIG. 7, optical component covering structure 46 may overlap structures in interior region IN of device 10 such as optical components 14 and 18.

In the example of FIG. 7, optical component 14C is a display (see, e.g., display 14 of FIG. 1) or other light-emitting device having colored light-emitting devices 44. Light-emitting devices 44 may include light-emitting diodes (e.g., organic light-emitting diodes and/or light-emitting diodes formed from crystalline semiconductor dies), lasers (e.g., vertical cavity surface-emitting lasers and/or other laser diodes), lamps, light sources that include light-guide plates and other light guiding structures configured to emit light over a distributed area, and/or other sources of light. Devices 44 may include light-emitting diodes and/or lasers of different colors (e.g., red, green, blue, etc.). In some configurations, relatively few of devices 44 may be included in component(s) 14C (e.g., to form a status indicator light, an illuminated icon, or a text display). In other configurations, component 14C may be a display such as display 14 of FIG. 1 and devices 44 may form a two-dimensional array of pixels for presenting images on the display. During operation, light emitted by components such as optical component 14C may pass through optical component covering structure 46 (e.g., emitted light may pass from interior IN to exterior EX through structure 46). Due to the neutral visible light transmission of structure 46, color images and other colored content may be presented on device 14C without imposing an undesired color cast on displayed images or other emitted light due to the passage of the light for the displayed images or other content through optical component covering structure 46. This allows the output of component 14C to be viewed through structure 46 by a viewer in exterior region EX without an undesired color cast.

Device 10 may also include one or more light receiving components such as optical component 18C. As shown in FIG. 7, optical component 18C may be overlapped by optical component covering structure 46. Component 18C may be an image sensor such as a color digital image sensor that captures images of the real world in exterior region EX or may be an ambient light sensor such as a color ambient light sensor (see, e.g., sensors 18 of FIG. 1). A color ambient light sensor may include multiple photodetectors with associated color sensitives. Each photodetector may be associated with a color channel of a different color (e.g., red, blue, green, etc.). There may be, for example, at least 3 at least 5, at least 7, at least 10, fewer than 50, fewer than 25, or fewer than 15 color channels in a color ambient light sensor each of which is used in making ambient light measurements at a different wavelength band. By processing measurements from each of the differently colored photodetectors, the color of the ambient light surrounding device 10 can be determined. Color may be measured in color coordinates, color temperature values, or other suitable color values.

During operation, ambient light passes from exterior region EX to interior region IN through optical component covering structure 46. Due to the neutral light transmission characteristics of structure 46, the color measurement made by optical component 18C will not be affected (e.g., no spectral shifts will be imposed on the ambient light being measured and the output of optical component 18C will be accurate). In configurations in which component 18C includes an image sensor, structure 46 will not impose an undesired color cast onto captured images.

In general, the optical components that are overlapped by structure 46 may include one or more light-emitting devices and/or one or more light-detecting devices. These devices may be used as ambient light sensors, image sensors, three-dimensional image sensors, status indicator lights, light-emitting diode arrays, and/or other components for emitting light and/or receiving light during the operation of device 10 (e.g., to form display 14 of FIG. 1, optical sensors such as a color ambient light sensor or other sensor 18 of FIG. 1, etc.).

Figure 8:
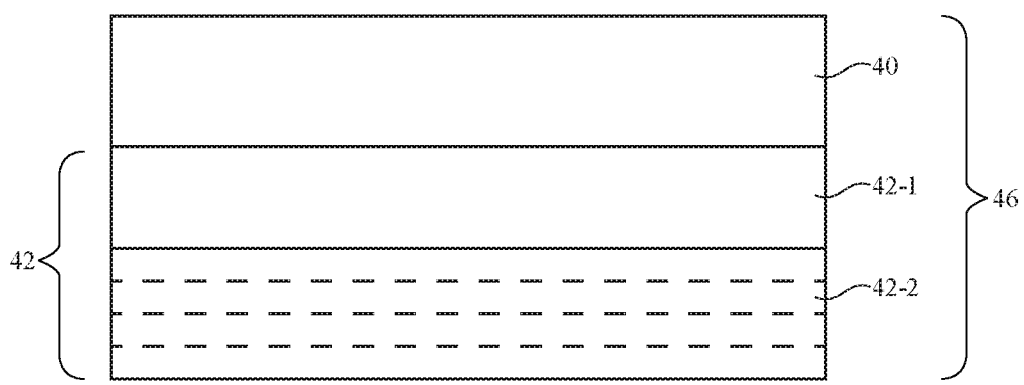
FIGS. 8, 9, 10, 11, 12, and 13 are cross-sectional side views of illustrative colored coatings with neutral visible light transmission spectrums in accordance with embodiments.

FIG. 8 is a cross-sectional side view of an illustrative optical component covering structure for device 10. In the example of FIG. 8, coating layer 42 has been formed from layer 42-1 and layer 42-2 on the surface of substrate 40. Layer 42-1 may, for example, be formed on the inner surface of substrate 40 and layer 42-2 may be formed on the inner surface of substrate 40. Substrate 40 may have an opposing outer surface that faces external region EX. If desired, layers 42-1 and/or 42-2 may be formed on the outer surface of substrate 40 or one of layers 42-1 may be formed on one surface of substrate 40 and another of layers 42-1 and 42-2 may be formed on the opposing surface of substrate 40. Arrangements in which coatings are formed on the inner surface of substrate 40 may sometimes be described as examples.

In the configuration of FIG. 8, layer 42-1 may be formed from a material such as polymer or other binder with colorant (e.g., dye and/or pigment) and layer 42-2 may be formed from a stack of dielectric thin-film layers of alternating refractive index (and/or semiconductor or metal layers) to form a thin-film interference filter. Layer 42-1 and layer 42-2 may have complementary light transmission characteristics as described in connection with curves 30 and 32 of FIG. 4 and may exhibit a non-neutral reflectivity (e.g., a non-neutral color) when viewed through substrate 40.

When viewed from the exterior of device 10, coating layer 42 and structure 46 may have a non-neutral appearance (e.g., a color other than gray, white, or black). Layer 42-2 may reflect light of the same color as layer 42-1 (e.g., red in the current example), thereby allowing the thickness of layer 42-1 to be minimized while exhibiting a given red color. In general, layers such as layers 42-1 and 42-1 may have any suitable thicknesses (e.g., at least 0.1 microns, at least 0.3 microns, at least 0.8 microns, at least 2 microns, at least 5 microns, less than 25 microns, less than 4 microns, less than 3 microns, etc.).

Figure 9:
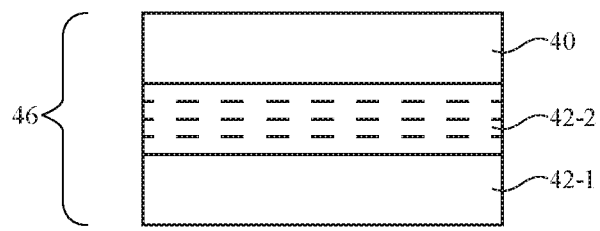

In the illustrative arrangement of FIG. 8, layer 42-2 may sometimes be referred to as the innermost or inner layer of coating 42 and layer 42-1 may sometimes be referred to as the outermost or outer layer of coating 42. If desired, the positions of layers 42-2 and 42-1 may be reversed, as shown in FIG. 9. In particular, a thin-film interference filter may be used in forming the outer layer and a colored ink layer may be used in forming the inner layer.

Figure 10:
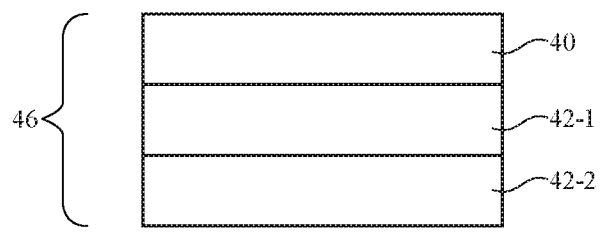

FIG. 10 shows how layers 42-1 and 42-2 may both be formed from polymers or other transparent materials containing colorant (e.g., dye and/or pigment). For example, layer 42-1 may be a layer of red ink and layer 42-2 may be formed form a layer of green ink. In transmission, the green ink layer may absorb red light to provide structure 46 with a neutral light transmission spectrum. The outward appearance of optical component covering structure 46 in this example may be red due to the presence of red ink in layer 42-1. If desired, layer 42-1 may be a thin-film interference filter configured to preferentially reflect light of a given color (e.g., red) and layer 42-2 may be a thin-film interference filter with a complementary light transmission spectrum.

Figure 11:
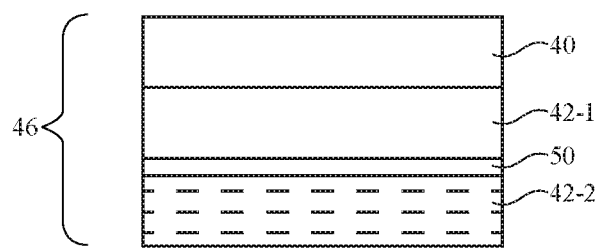

In the illustrative example of FIG. 11, layer 42-1 is a layer of colored ink (e.g., red ink or ink with another desired non-neutral tint), layer 50 is an adhesive layer (e.g., a clear layer with a neutral transmission spectrum), and layer 42-2 is a thin-film inference filter film (e.g., a thin-film stack such as a dielectric stack having layers of alternating higher and lower refractive index values that is formed on a flexible polymer sheet that serves as a carrier for the dielectric stack or other thin-film stack). Adhesive layer 50 may be used to couple layer 42-2 to layer 42-1.

Figure 12:
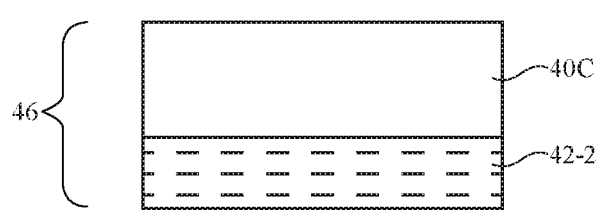

FIG. 12 is a cross-sectional side view of structure 46 in an illustrative configuration in which layer 40C is a colored substrate (e.g., a transparent layer of red glass or red polymer). The color of substrate layer 40C may be selected to provide device 10 with a desired non-neutral color. The transmission of substrate layer 42-1 (e.g., a thin-film interference filter layer or a colored ink) may be configured to be complementary to the light transmission spectrum of substrate 40C, so that structure 46 has a neutral light transmission spectrum.

Figure 13:
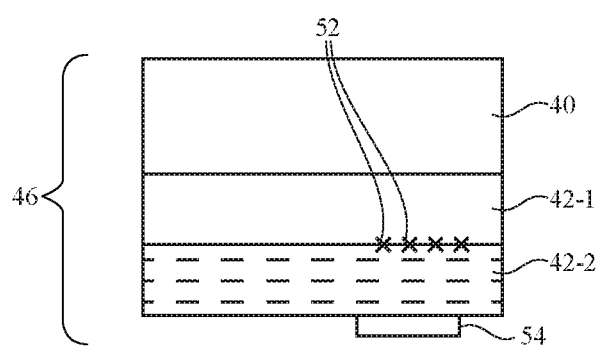

In the example of FIG. 13, a diffusing layer such as diffusing layer 54 (e.g., a layer of white ink, a textured structure, etc.) may be formed on the inner surface of layer 42-2 (e.g., in alignment with a color ambient light sensor). If desired, a diffuser such as diffuser layer 54 may be formed between layers 42-1 and 42-2, as shown by illustrative diffusing layer 52 (e.g., texture, white ink, etc.). Light may also be diffused by providing some or all of a inner or outer polymer layer or other layer in structure 46 with a hazy appearance (e.g., by incorporating a hazy additive such as light-scattering particles, by incorporating air bubbles, by forming light-scattering texture, etc.).

Diffusers may be formed above light detectors. For example, a diffuser may overlap an ambient light sensor to help reduce the sensitivity of ambient light measurements made with the detector to the direction of incoming ambient light. Diffusers may also overlap light-emitting devices such as light-emitting diodes and/or lasers to help homogenize the appearance of emitted light. For example, a diffuser layer such as layer 54 and/or 52 may overlap light-emitting structures (e.g., light-emitting devices such as light-emitting diodes and/or lasers, etc.).

Figure 14:
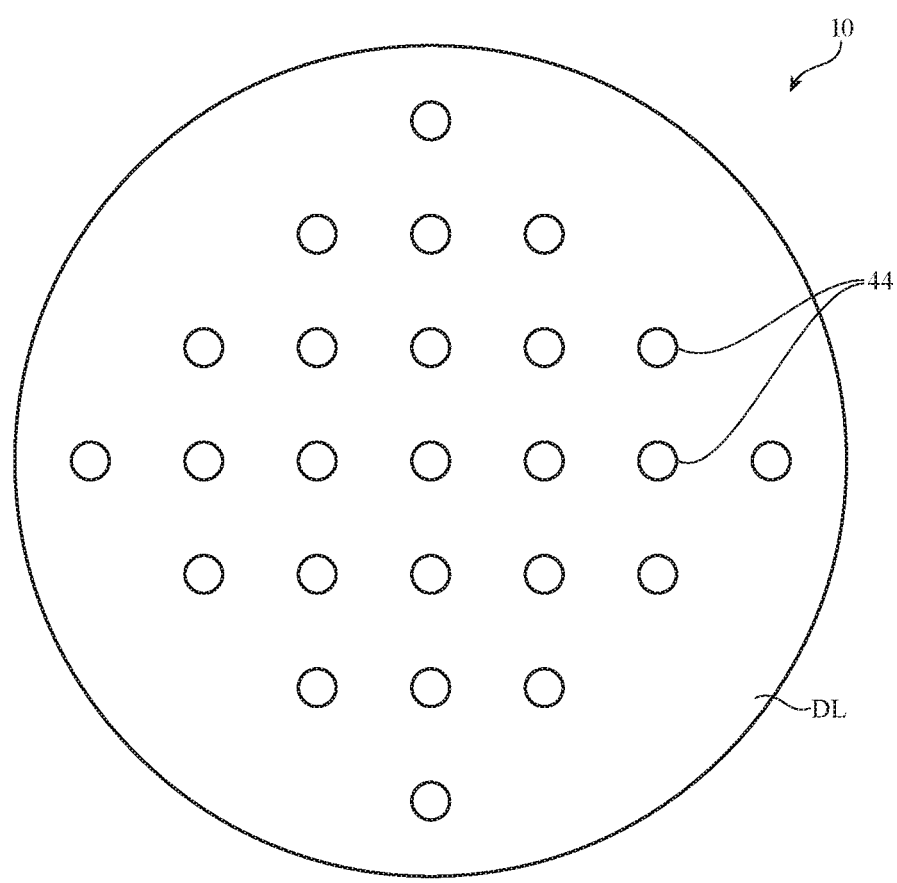
FIG. 14 is a top view of an illustrative optical component covering structure that is covering an array of light-emitting diodes in accordance with an embodiment.

FIG. 14 is a top view of an illustrative electronic device such as device 10 showing how an array of light-emitting diodes or other light-emitting devices 44 may be covered with a diffuser layer DL that is formed on the inner surface of layer 42-2 as shown by layer 54 of FIG. 13, that is formed between layers 42-1 and 42-2 as shown by layer 52, and/or that is otherwise incorporated into optical component covering structure 46.

Figure 15:
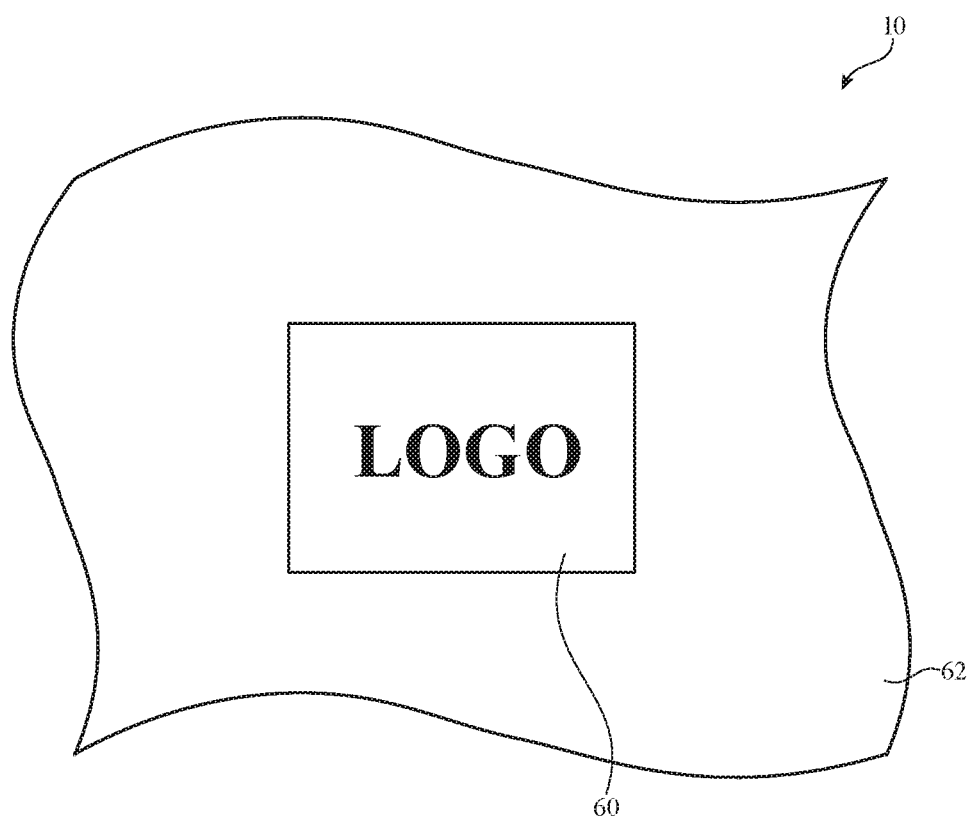
FIG. 15 is a view of an exterior surface of an electronic device with an illustrative logo and background of the type that may be formed using optical component covering structures in accordance with an embodiment.

FIG. 15 is a top view of device 10 in an illustrative arrangement in which layer 42-1 and/or layer 42-2 have been patterned and provided with varied properties in different surface areas on device 10 to form neutrally transmitting area with different outwardly appearing colors such as regions 60 and 62. There may be any suitable number of regions of differing colors. There are two differently colored regions in the example of FIG. 15.

As shown in FIG. 15, region 60 may be, for example, a logo-shaped region and region 62 may be a background region. Configurations in which regions 60 and 62 form trim, text, icons, geometric shapes, and other patterned areas may also be used. The appearances of regions 60 and/or 62 may be non-neutral and/or neutral. As an example, region 62 may have a blue appearance or gray appearance and region 60 may have a red appearance. Both regions 62 and 60 may exhibit a neutral light transmission characteristic. In this type of arrangement, regions 62 and 60 may overlap optical components and may serve as optical component covering structure 46.

Although sometimes described in the context of illustrative arrangements in which structure 46 exhibits a flat light transmission spectrum across visible light wavelengths, arrangements in which the light transmission spectrum of coating 42 and structure 46 are not flat may also be used. For example, curves 30 and 32 of FIG. 4 may not be complementary, but rather may be configured to provide transmission spectrum 34 of FIG. 5 with a peak at a desired wavelength band or set of bands. This type of arrangement may be used, for example, to compensate for differences in light emission efficiency of light-emitting devices 44 of different colors, to provide emitted light with a desired color cast, to filter incoming ambient light passing to a color ambient light sensor, etc.

The foregoing is merely illustrative and various modifications can be made to the described embodiments. The foregoing embodiments may be implemented individually or in any combination.

What is claimed is:

1. An electronic device that has an interior region and that is surrounded by an exterior region, the electronic device comprising:
   an optical component in the interior region; and
   an optical component covering structure between the optical component and the exterior region, wherein the optical component covering structure has a neutral visible light transmission and exhibits a non-neutral color to the exterior region.

2. The electronic device defined in claim 1, wherein the optical component comprises a light-emitting device and wherein the optical component covering structure comprises:
   a transparent substrate;
   a colored ink coating on an inner surface of the transparent substrate facing the interior region; and
   a thin-film interference filter on the colored ink coating that has a visible light transmission spectrum complementary to the colored ink coating.

3. The electronic device defined in claim 2 wherein the optical component covering structure has a visible light transmission spectrum that varies by less than 5% between 400 nm and 700 nm.

4. The electronic device defined in claim 3 wherein the optical component comprises an array of light-emitting diodes of different colors.

5. The electronic device defined in claim 1 wherein the optical component comprises a display with pixels of different colors.

6. The electronic device defined in claim 1 wherein the optical component comprises a light detector.

7. The electronic device defined in claim 1 wherein the optical component comprises a color ambient light sensor.

8. The electronic device defined in claim 1 further comprising:
   control circuitry; and
   input-output devices including a speaker in the interior region.

9. The electronic device defined in claim 1 wherein the optical component covering structure comprises:
   a substrate;
   a first layer on a surface of the substrate; and
   a second layer on the first layer, wherein the first layer is between the second layer and the substrate.

10. The electronic device defined in claim 9 wherein the second layer comprises a thin-film interference filter.

11. The electronic device defined in claim 10 wherein the first layer comprises a polymer with colorant.

12. The electronic device defined in claim 9 wherein the first layer comprises a thin-film interference filter and wherein the second layer comprises a polymer layer with colorant.

13. The electronic device defined in claim 9 wherein the first layer comprises a first polymer layer with a first colorant of a first color and wherein the second layer comprises a second polymer layer with a second colorant of a second color that is different than the first color.

14. The electronic device defined in claim 9 wherein the optical component covering structure comprises a diffuser that overlaps the optical component and that is located between the first and second layers.

15. The electronic device defined in claim 9 wherein the optical component covering structure comprises a diffuser that overlaps the optical component, wherein the first and second layers are between the substrate and the diffuser.

16. The electronic device defined in claim 1 wherein the optical component covering structure comprises a first layer, a second layer, and an adhesive layer between the first and second layers and wherein the first and second layers have complementary first and second light transmission spectrums.

17. An electronic device that has an interior region and that is surrounded by an exterior region, comprising:
control circuitry in the interior region;
input-output devices in the interior region, wherein the input-output devices include an optical component; and
an optical component covering structure that overlaps the optical component and that is between the interior region and the exterior region, wherein the optical component covering structure comprises:
a substrate layer having a non-neutral color and a first visible light transmission spectrum; and
a thin-film interference filter having a second visible light transmission spectrum that is complementary to the first visible light transmission spectrum.

18. The electronic device defined in claim 17 wherein the thin-film interference filter comprises a stack of dielectric layers.

19. An electronic device that has an interior region and that is surrounded by an exterior region, comprising:
control circuitry in the interior region;
input-output devices in the interior region, wherein the input-output devices include an optical component, wherein the optical component is selected from the group consisting of: an array of light-emitting diodes, a display, and a color ambient light sensor; and
an optical component covering structure that overlaps the optical component and that is located between the interior region and the exterior region, wherein the optical component covering structure comprises:
a clear substrate layer;
a first layer on the clear substrate layer that has a first visible light transmission spectrum; and
a second layer that has a second visible light transmission spectrum that is complementary to the first visible light transmission spectrum, wherein the first layer is between the clear substrate layer and the second layer and wherein the optical component covering structure has a non-neutral color when viewed from the exterior region.

20. The electronic device defined in claim 19 wherein the first and second layers are formed on an interior surface of the clear substrate layer, wherein the first layer comprises a colored polymer layer, and wherein the second layer comprises a thin-film interference filter formed from a stack of dielectric layers.

* * * * *